United States Patent
Kierse

(10) Patent No.: US 7,880,244 B2
(45) Date of Patent: Feb. 1, 2011

(54) WAFER LEVEL CSP SENSOR

(75) Inventor: Oliver Kierse, County Clare (IE)

(73) Assignee: Analog Devices, Inc., Norwood, MA (US)

( * ) Notice: Subject to any disclaimer, the term of this patent is extended or adjusted under 35 U.S.C. 154(b) by 9 days.

(21) Appl. No.: 12/423,071

(22) Filed: Apr. 14, 2009

(65) Prior Publication Data

US 2009/0256216 A1 Oct. 15, 2009

Related U.S. Application Data

(60) Provisional application No. 61/044,952, filed on Apr. 15, 2008.

(51) Int. Cl.
*H01L 27/14* (2006.01)

(52) U.S. Cl. .............. 257/414; 257/690; 257/E29.166; 257/E23.011

(58) Field of Classification Search ............... 257/414, 257/690, E29.166, E23.011
See application file for complete search history.

(56) References Cited

U.S. PATENT DOCUMENTS

| | | | | |
|---|---|---|---|---|
| 5,072,283 | A | 12/1991 | Bolger | 257/676 |
| 5,701,008 | A | 12/1997 | Ray et al. | 250/352 |
| 5,869,883 | A | 2/1999 | Mehringer et al. | 257/667 |
| 6,376,769 | B1 | 4/2002 | Chung | 174/524 |
| 6,893,574 | B2 | 5/2005 | Felton et al. | 216/2 |
| 6,894,358 | B2* | 5/2005 | Leib et al. | 257/414 |
| 7,109,055 | B2* | 9/2006 | McDonald et al. | 438/51 |
| 7,115,961 | B2 | 10/2006 | Watkins et al. | 257/433 |
| 7,326,932 | B2 | 2/2008 | Hynes et al. | 250/353 |
| 2002/0037026 | A1 | 3/2002 | Sato et al. | 374/132 |
| 2002/0037633 | A1 | 3/2002 | Satou et al. | 438/476 |
| 2003/0193018 | A1 | 10/2003 | Tao et al. | 250/239 |
| 2004/0173751 | A1 | 9/2004 | Komobuchi et al. | 250/338.1 |
| 2006/0035415 | A1* | 2/2006 | Wood et al. | 438/125 |
| 2006/0118721 | A1 | 6/2006 | Antoszewski et al. | 250/338.4 |
| 2006/0163453 | A1 | 7/2006 | Hynes et al. | 250/214 R |
| 2006/0266938 | A1 | 11/2006 | Abela | 250/239 |
| 2007/0045515 | A1 | 3/2007 | Farnworth et al. | 250/208.1 |
| 2007/0045632 | A1 | 3/2007 | Oliver et al. | 257/79 |

(Continued)

FOREIGN PATENT DOCUMENTS

JP 2001267372 9/2001

(Continued)

OTHER PUBLICATIONS

International Searching Authority, International Search Report and Written Opinion, PCT/US2009/040420, dated Aug. 7, 2009.

(Continued)

*Primary Examiner*—Trung Dang
(74) *Attorney, Agent, or Firm*—Sunstein Kann Murphy & Timbers LLP

(57) ABSTRACT

An electronics package has a wafer level chip scale package (WLCSP) die substrate containing electronic circuits. Through-silicon vias through the die substrate electrically connect the electronic circuits to the bottom surface of the die substrate. A package sensor is coupled to the die substrate for sensing an environmental parameter. A protective encapsulant layer covers the top surface of the die substrate. A sensor aperture over the package sensor provides access for the package sensor to the environmental parameter.

22 Claims, 4 Drawing Sheets

U.S. PATENT DOCUMENTS

2007/0063145 A1  3/2007  Kierse et al. .......... 250/370.14
2009/0166785 A1* 7/2009  Camacho et al. ............ 257/433

FOREIGN PATENT DOCUMENTS

| | | |
|---|---|---|
| JP | 2001308349 | 11/2001 |
| JP | 2003270047 | 9/2003 |
| JP | 2005191660 | 7/2005 |

OTHER PUBLICATIONS

Hock, et al, "Development of Transfer Molding Technology for Package with Die Active Side Partially Exposed", 2003 *Electronic Components and Technology Conference*, 0-7803-7991-5/03—2003 IEEE, pp. 365-372.

Lahiji, et al, "A Batch-Fabricated Silicon Thermopile Infrared Detector", *IEEE Transactions on Electron Devices*, vol. ED-29(1), (Jan. 1982), pp. 14-22.

* cited by examiner

WAFER LEVEL CSP SENSOR

This application claims priority from U.S. Provisional Patent Application 61/044,952, filed Apr. 15, 2008, which is incorporated herein by reference.

FIELD OF THE INVENTION

The present invention relates to a wafer level chip scale package containing a package sensor.

BACKGROUND ART

Packaging of electronic devices serves multiple functions including to protect the enclosed circuit die surface and to provide a stress release mechanism between the die and the printed circuit board. In addition, the package needs to be compatible with application requirements for small size, high density, and low cost. One well known and long used device packing arrangement is the lead frame package. Although this is a robust package, it is relatively too large for some newer applications such as many cell phone applications.

Circuit dies recently have been encapsulated at the wafer level before slicing to produce a significantly smaller package. A Wafer Level Chip Scale Package (WLCSP) extends the wafer fabrication process to include device interconnection and device protection processes to produce an electronic device package with the same footprint area and only slightly larger than the enclosed die. FIG. 1 shows an elevated bottom perspective view of a typical WLCSP 10 according to the prior art. A wafer die 11 contains the device circuitry 12. An array of solder ball electrical contacts 13 (also referred to as "bumps") on the bottom surface of the WLCSP 10 connect the device circuitry 12 within the WLCSP 10 to an external circuit structure such as a circuit board. As compared to lead frame packages, WLCSPs are far smaller and less expensive to produce. However, WLCSPs may be somewhat less robust physically such that they are not suitable for all applications, and a significant place still remains for lead frame packages.

In one common application of electronic devices is as sensors for sensing environmental characteristics in the vicinity of the device. For example, an electronic device may include an infrared (IR) sensor which may typically be fabricated into a device die element to form an integrated circuit chip. The sensor typically is covered by a cap that protects the sensor while still allowing the sensor to sense the environmental characteristic. For example, the cap may have a transparent window that allows IR radiation to be sensed. U.S. Patent Application 20070063145, hereby incorporated by reference, described an IR sensor fabricated in a leadframe package, but provided no teaching or suggestion as to how an IR sensor might be fabricated in a WLCSP.

SUMMARY OF THE INVENTION

Embodiments of the present invention include an electronics package that has a wafer level chip scale package (WLCSP) die substrate containing electronic circuits. Through-silicon vias through the die substrate electrically connect the electronic circuits to the bottom surface of the die substrate. A sensor is fabricated on or coupled to the die substrate for sensing an environmental parameter. The sensor element is protected by a cap. A protective encapsulant layer covers the top surface of the die substrate. An aperture over the package sensor provides access for the package sensor to the environmental parameter.

In further specific embodiments, a sensor cap covers the package sensor and has an upper cap surface transparent to the environmental parameter. The upper cap surface may also have focusing elements for focusing the environmental parameter for the package sensor.

In a specific embodiment, the package sensor may be coupled to the top surface of the die substrate and the sensor aperture is contained in the protective encapsulant layer. The protective encapsulant layer has a top surface that is flush with the upper cap surface, or the top surface may be higher than the upper cap surface, or the upper cap surface may protrude above the top surface of the protective encapsulant layer. Alternatively, the package sensor may be coupled to the bottom surface of the die substrate and the sensor aperture may be contained in an aperture mask covering the package sensor. In some embodiments, thickness of the protective encapsulant layer and size of the aperture determine a sensing field for sensing of the environmental parameter by the package sensor. And, at least one of the through-silicon vias may be beneath the sensor cap and at least one of the through-silicon vias may be not beneath the sensor cap.

In any of the above embodiments, the protective encapsulant layer may be opaque. The package sensor may specifically be an infrared sensor, an optical sensor, a pressure sensor, or an audio microphone.

Embodiments of the present invention also include an electronics package which has a wafer level chip scale package (WLCSP) die substrate containing electronic circuits and a top surface and a bottom surface. Circuit connecting means go through the die substrate to electrically connect the electronic circuits to the bottom surface of the die substrate. Sensing means are coupled to the die substrate for sensing an environmental parameter. Encapsulating means cover the top surface of the die substrate, and aperture means are over the sensing means to provide access for the sensing means to the environmental parameter.

In further such embodiments, there may be capping means covering the sensing means and having an upper cap surface transparent to the environmental parameter. The upper cap surface may further include focusing means for focusing the environmental parameter for the sensing means. The sensing means may be coupled to the top surface of the die substrate and the aperture means may be contained in the encapsulating means. The encapsulating means may have a top surface that is flush with or higher than the upper cap surface. Or the upper cap surface may protrude above a top surface of the protective encapsulant layer. In some embodiments, thickness of the encapsulating means and size of the aperture means determine a sensing field for sensing of the environmental parameter by the sensing means. And at least one of the circuit connecting means may be beneath the sensor cap and at least one of the circuit connecting means may be not beneath the capping means.

In specific embodiments, sensing means may be coupled to the bottom surface of the die substrate and the aperture means may be contained in an aperture mask covering the sensing means. The encapsulating means may be opaque. The sensing means may be an infrared sensing means, an optical sensing means, a pressure sensing means, or an audio sensing means.

DETAILED DESCRIPTION OF SPECIFIC EMBODIMENTS

Figure 1:
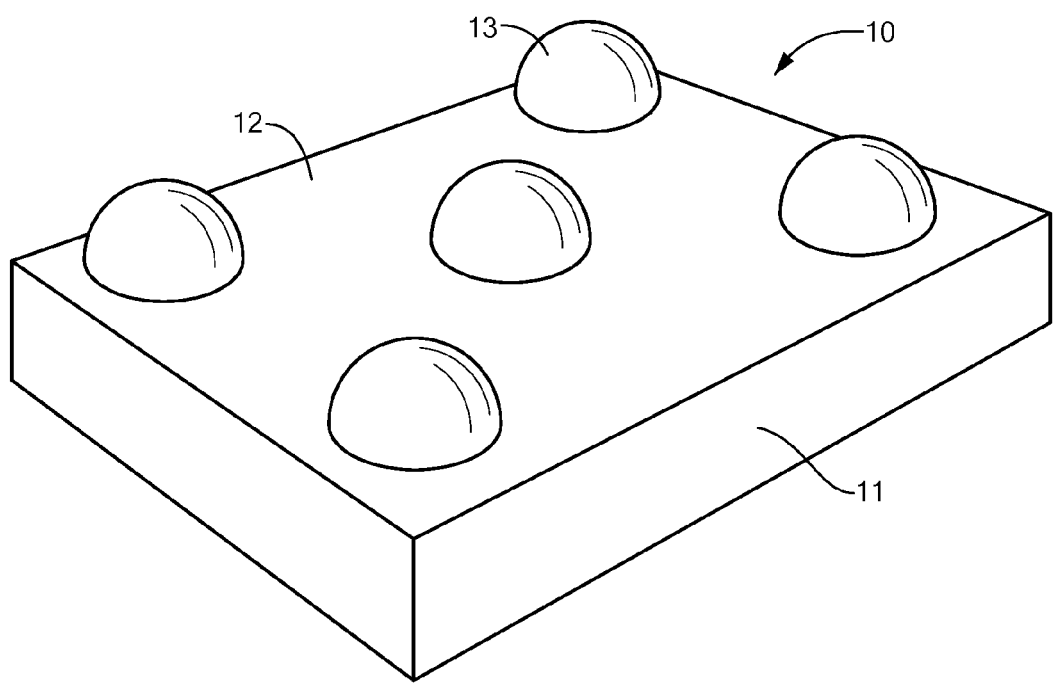
FIG. 1 shows an elevated bottom perspective view of a typical WLCSP 10 according to the prior art.
Figure 2:
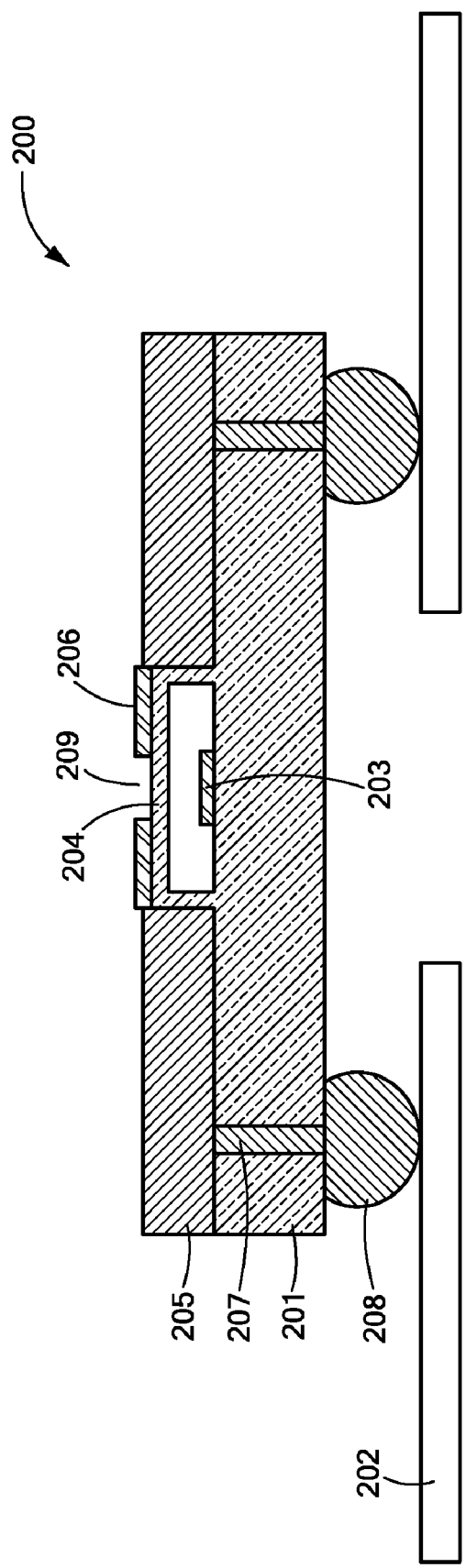
FIG. 2 shows a first embodiment of a wafer level chip scale package (WLCSP) sensor package.

There is a need for a Wafer Level Chip Scale Package (WLCSP) which includes an electronic sensor such as an infra-red (IR) sensor. Such a smaller and less expensive package would be useful in many existing applications. FIG. 2 shows one example of a WLCSP 200 having a die substrate 201 that contains various electronic circuits and/or various electromechanical devices such as MEMS devices. Through-silicon vias 207 through the die substrate 201 electrically connect the electronic circuits to the bottom surface of the die substrate 201. This use of through-silicon vias 207 (which may not be needed in larger scale lead frame packages) contributes to being able to connect the relatively small size WLCSP 200 to an external circuit structure such as a circuit board 202.

A package sensor 203 such as an IR sensor is coupled to the top surface of the die substrate 201 for sensing an environmental parameter such as infra-red radiation. Although various exemplary embodiments of the invention are discussed herein, it should be apparent to those skilled in the art that various changes and modifications can be made which will achieve some of the advantages of the invention without departing from the true scope of the invention. For example, although a package sensor 203 is discussed in the specific form of an infra-red (IR) sensor, in other embodiments, the package sensor 203 may specifically be another type of sensor such as an optical sensor, a pressure sensor, or an audio microphone.

An opaque protective encapsulant layer 205 covers the top surface of the die substrate 201 and protects the circuits and/or devices in the die substrate 201. That is, the encapsulant layer protects the device from many different types of environmental hazards, including without limitation, humidity, mechanical shock, and environmental radiation such as the very IR radiation that the package sensor 203 is present to detect. The upper surface of the encapsulant layer 205 also is convenient for pick-up and handling of the sensor package 200, such as by the handling head of a circuit board assembler system, while also protecting the cap surface from direct contact.

A sensor cap 204 covers the package sensor 203 and has an upper cap surface transparent to the environmental parameter. In the embodiment shown in FIG. 2, the protective encapsulant layer 205 has a top surface that is flush with the upper cap surface of the sensor cap 204. An opaque aperture mask 206 over the upper cap surface of the sensor cap 204 includes an opening that defines a sensor aperture 209 over the package sensor 203 that provides access for the package sensor to the environmental parameter. The encapsulant layer 205 also protects the sensor cap 204 and prevents the environmental parameter (e.g., IR radiation) from passing through the sidewalls of the cap in towards the package sensor 203. In addition, the sensor cap 204 also provides a favorable environment (e.g., a vacuum) for any micromachined elements (e.g., MEMS structures) that may be contained within.

The upper cap surface of the sensor cap 204 may also include focusing elements for focusing the environmental parameter for the package sensor 203. For example, in one embodiment the focusing elements are optical rings that are etched into the upper cap surface of the sensor cap 204. Etched silicon focusing elements are explained in greater detail in U.S. Patent Application 20060163453, which is incorporated herein by reference.

Figure 3:
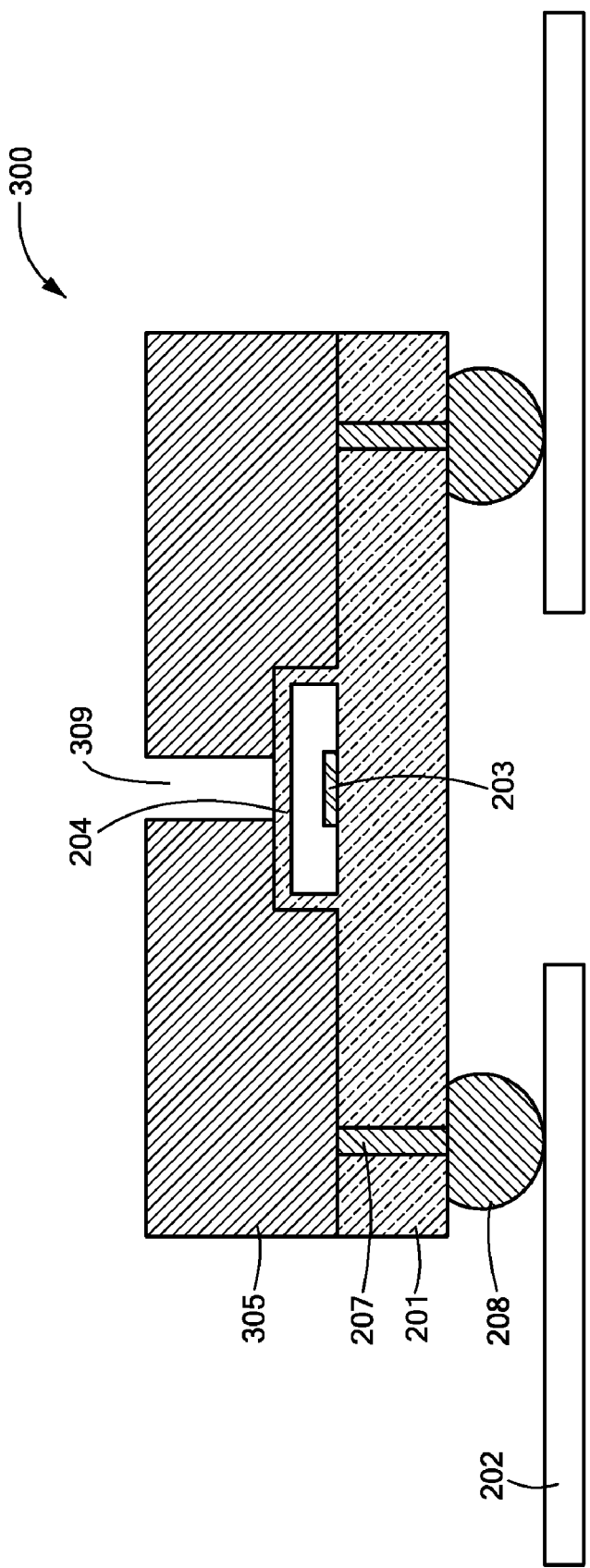
FIG. 3 shows a second embodiment of a WLCSP sensor package.

FIG. 3 shows a second embodiment of a WLCSP sensor package 300 in which the top surface of the protective encapsulant layer 305 is higher than the upper cap surface of the protective cap 204, making the sensor aperture 309 deeper. This also eliminates the need for the opaque aperture mask 206 shown in FIG. 2. In another embodiment, the WLCSP package may have the package sensor coupled to the bottom surface of the die substrate and/or the sensor aperture may be formed in an aperture mask that covers the package sensor. In some embodiments, the thickness of the protective encapsulant layer 305 and the size of the sensor aperture 309 may be arranged to determine a sensing field for sensing of the environmental parameter by the package sensor 203.

Figure 4:
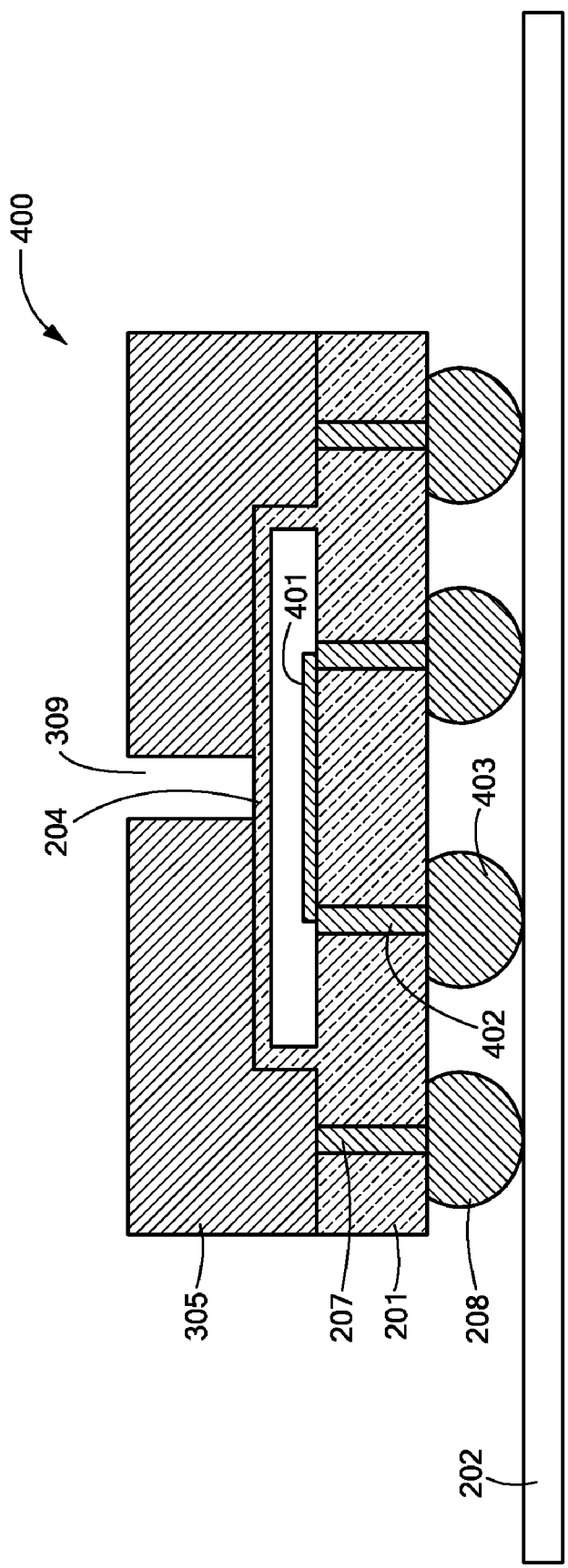
FIG. 4 shows a third embodiment of a WLCSP sensor package.

FIG. 4. shows another embodiment of a WLCSP 400 similar to the one shown in FIG. 3. In the embodiment shown in FIG. 4, some or all of the through-silicon vias 402 may be beneath the sensor cap 204 while others of the through-silicon vias 402 may be not beneath the sensor cap 204 but rather outside it. This kind of arrangement can be used to independently connect sensor device elements and electronic circuit elements on the chip to an underlying circuit board such that some or all of the connections between the sensor device elements and electronic circuit elements on the chip are through through-silicon vias 402 and 207 and the underlying circuit board, rather than directly through the chip structures or connections. This can eliminate topography changes (caused by interconnects between the sensor 203 and the ADC circuitry) under the cap seal, which can cause poor bonding, loss of hermeticity etc. It is also a flexible approach that allows for some application-specific customization when implementing a given WLCSP 400 in a specific application.

Standard WLCSP fabrication processes may be used with the exception of the sensor capping and encapsulant molding stages. The sensor caps 204 may be attached to silicon die substrates 201 before singulation of the wafer into individual devices. Specifically, an embodiment may attach individual silicon sensor caps 204 to individual die substrates locations on the silicon wafer before singulation (e.g., by glue or other adhesive, for example, Ablestik 8290 die attach glue), or alternatively, a cap structure may contain multiple correctly spaced and aligned sensor caps 204 (such as for an entire wafer or a portion of a wafer) which is positioned over the wafer. After placement of the sensor caps 204 the cap structure may removed before encapsulation (e.g., by breaking frangible connection points) or in some embodiments, may simply be left in place and covered with the encapsulant material during molding. Once the sensor caps 204 have been attached to the die substrates 201, the aperture masks (if any) may be applied, for example, by photolithography. Alternatively, aperture masks may be pre-developed on the sensor caps 204 before attachment to the die substrates 201, or the mold compound may act as an aperture mask.

The silicon wafer with attached sensor caps 204 is covered by a mold for developing the encapsulation layer 205. The upper part of the mold cavity includes insert posts or blocks to define the sensor aperture 209. Encapsulant materials such as Sumitomo G770 series mold compound is provided into the mold cavity, flowing around the aperture inserts. Once the encapsulant material sets into solid form, the mold and aperture inserts are removed and the wafer may be singulated into individual devices.

Among the various advantages of WLCSP sensor packages such as some of those described above, is a significantly lower cost over older larger packaging solutions. For example, whereas an older generation sensor package might cost around $1.00 per device to manufacture, some embodiments of the present invention may cost far less, for example, around $0.10 per device.

Although various exemplary embodiments of the invention have been disclosed, it should be apparent to those skilled in the art that various changes and modifications can be made which will achieve some of the advantages of the invention without departing from the true scope of the invention.

What is claimed is:

1. An electronics package comprising:
   a wafer level chip scale package (WLCSP) die containing electronic circuits and having a top surface and a bottom surface;
   a plurality of through-silicon vias through the die for electrically connecting the electronic circuits to the bottom surface of the die;
   a package sensor coupled to the die for sensing an environmental parameter;
   a sensor cap substantially smaller than the die covering and enclosing the package sensor and having an upper cap surface transparent to the environmental parameter
   a protective encapsulant layer of mold compound material flow molded over the top surface of the die and the sensor cap; and
   a sensor aperture through the protective encapsulant layer over the sensor cap to provide access for the package sensor to the environmental parameter.

2. An electronics package according to claim 1, wherein the upper cap surface includes focusing elements for focusing the environmental parameter for the package sensor.

3. An electronics package according to claim 1, wherein the package sensor is coupled to the top surface of the die substrate and the sensor aperture is contained in the protective encapsulant layer.

4. An electronics package according to claim 3, wherein the protective encapsulant layer has a top surface flush with the upper cap surface.

5. An electronics package according to claim 3, wherein the upper cap surface protrudes above a top surface of the protective encapsulant layer.

6. An electronics package according to claim 3, wherein the protective encapsulant layer has a top surface higher than the upper cap surface.

7. An electronics package according to claim 6, wherein thickness of the protective encapsulant layer and size of the aperture determine a sensing field for sensing of the environmental parameter by the package sensor.

8. An electronics package according to claim 1, wherein at least one of the through-silicon vias is beneath the sensor cap and at least one of the through-silicon vias is not beneath the sensor cap.

9. An electronics package according to claim 1, wherein the package sensor is coupled to the bottom surface of the die substrate and the sensor aperture is contained in an aperture mask covering the package sensor.

10. An electronics package according to claim 1, wherein the protective encapsulant layer is opaque.

11. An electronics package according to claim 1, wherein the package sensor is one of an infrared sensor, an optical sensor, a pressure sensor, and an audio microphone.

12. An electronics package comprising:
    a wafer level chip scale package (WLCSP) die containing electronic circuits and having a top surface and a bottom surface;
    a plurality of circuit connecting means through the die for electrically connecting the electronic circuits to the bottom surface of the die;
    sensing means coupled to the die for sensing an environmental parameter;
    capping means substantially smaller than the die covering and enclosing the sensing means and having an upper cap surface transparent to the environmental parameter;
    encapsulating means of mold compound material flow molded over the top surface of the die and the sensor cap; and
    aperture means through the encapsulating means over the capping means to provide access for the sensing means to the environmental parameter.

13. An electronics package according to claim 12, wherein the upper cap surface includes focusing means for focusing the environmental parameter for the sensing means.

14. An electronics package according to claim 12, wherein the sensing means are coupled to the top surface of the die substrate and the aperture means is contained in the encapsulating means.

15. An electronics package according to claim 14, wherein the upper cap surface protrudes above a top surface of the protective encapsulant layer.

16. An electronics package according to claim 14, wherein the encapsulating means has a top surface flush with the upper cap surface.

17. An electronics package according to claim 14, wherein the encapsulating means has a top surface higher than the upper cap surface.

18. An electronics package according to claim 17, wherein thickness of the encapsulating means and size of the aperture means determine a sensing field for sensing of the environmental parameter by the sensing means.

19. An electronics package according to claim 12, wherein at least one of the circuit connecting means is beneath the sensor cap and at least one of the circuit connecting means is not beneath the capping means.

20. An electronics package according to claim 12, wherein the sensing means are coupled to the bottom surface of the die substrate and the aperture means is contained in an aperture mask covering the sensing means.

21. An electronics package according to claim 12, wherein the encapsulating means is opaque.

22. An electronics package according to claim 12, wherein the sensing means is one of an infrared sensing means, an optical sensing means, a pressure sensing means, and an audio sensing means.

* * * * *